(12) United States Patent
Wu et al.

(10) Patent No.: US 9,896,759 B2
(45) Date of Patent: Feb. 20, 2018

(54) OLED MATERIAL VACUUM THERMAL EVAPORATING MASK PLATE

(71) Applicant: Shenzhen China Star Optoelectronics Technology Co., Ltd., Shenzhen, Guangdong (CN)

(72) Inventors: Tsungyuan Wu, Guangdong (CN); Yawei Liu, Guangdong (CN)

(73) Assignee: Shenzhen China Star Optoelectronics Co., Ltd, Shenzhen, Guangdong (CN)

( * ) Notice: Subject to any disclaimer, the term of this patent is extended or adjusted under 35 U.S.C. 154(b) by 454 days.

(21) Appl. No.: 14/429,352

(22) PCT Filed: Feb. 9, 2015

(86) PCT No.: PCT/CN2015/072481
§ 371 (c)(1),
(2) Date: Mar. 18, 2015

(87) PCT Pub. No.: WO2016/086536
PCT Pub. Date: Jun. 9, 2016

(65) Prior Publication Data
US 2016/0348227 A1    Dec. 1, 2016

(30) Foreign Application Priority Data

Dec. 4, 2014 (CN) .......................... 2014 1 0734443

(51) Int. Cl.
*C23F 1/00* (2006.01)
*H01L 21/306* (2006.01)
(Continued)

(52) U.S. Cl.
CPC ............ *C23C 14/042* (2013.01); *C23C 14/04* (2013.01); *C23C 14/24* (2013.01); *H01L 51/001* (2013.01); *H01L 51/0011* (2013.01)

(58) Field of Classification Search
CPC .... C23C 14/042; C23C 14/04; H01L 51/0011
(Continued)

(56) References Cited

U.S. PATENT DOCUMENTS 5,013,275 A * 5/1991 Kautz ..................... H01J 9/142
219/121.63
5,825,463 A * 10/1998 Hara ....................... G03F 7/707
355/72

(Continued)

*Primary Examiner* — Keath T Chen
(74) *Attorney, Agent, or Firm* — Andrew C. Cheng

(57) ABSTRACT

The present invention provides an OLED material vacuum thermal evaporating mask plate, comprising a mask frame (1), a quickset (3) fixed on the mask frame (1) and a mask (5) fixed on the quickset (3); the mask frame (1) comprises four edges, and the four edges surround to form an opening corresponding to the mask (5); each edge of the mask frame (1) comprises a groove (11) dented at the upper surface; the quickset (3) is fixed in the groove (11); the mask (5) is fixed on the quickset (3) by point weld, and welding points (7) are on the quickset (3). When the mask deforms and the replacement is necessary, only the quickset is extracted for polishing or is replaced. The mask frame can be repeatedly used to diminish the waste amount and to raise the availability of the mask frame. Meanwhile, the spare amount of the mask frame can be reduced to save material and production cost.

9 Claims, 6 Drawing Sheets

(51) Int. Cl.
*C23C 14/04* (2006.01)
*C23C 14/24* (2006.01)
*H01L 51/00* (2006.01)

(58) Field of Classification Search
USPC .................................................. 156/345.19
See application file for complete search history.

(56) References Cited

U.S. PATENT DOCUMENTS

| | | | |
|---|---|---|---|
| 6,513,781 B1* | 2/2003 | Meyer | F01D 25/285 |
| | | | 248/544 |
| 2005/0194475 A1* | 9/2005 | Kim | C23C 16/507 |
| | | | 239/690 |
| 2011/0139069 A1* | 6/2011 | Ahn | C23C 14/042 |
| | | | 118/504 |
| 2011/0220019 A1* | 9/2011 | Lee | C23C 14/042 |
| | | | 118/504 |
| 2014/0130733 A1* | 5/2014 | Han | C23C 14/042 |
| | | | 118/504 |
| 2015/0007767 A1* | 1/2015 | Ko | B05B 15/0481 |
| | | | 118/504 |

* cited by examiner

OLED MATERIAL VACUUM THERMAL EVAPORATING MASK PLATE

FIELD OF THE INVENTION

The present invention relates to a manufacture field of an Organic Light Emitting Diode, and more particularly to an OLED material vacuum thermal evaporating mask plate.

BACKGROUND OF THE INVENTION

Organic Light Emitting Diode (OLED) is a flat panel display technology which has great prospects for development. It possesses extremely excellent display performance, and particularly the properties of self-illumination, simple structure, ultra thin, fast response speed, wide view angle, low power consumption and capability of realizing flexible display, and therefore is considered as the "dream display". Meanwhile, the investment for the production equipments is far smaller than the TFT-LCD. It has been favored by respective big display makers and has become the main selection of the third generation display element of the display technology field. At present, the OLED has reached the point before mass production. With the further research and development, the new technologies constantly appear, and someday, there will be a breakthrough for the development of the OLED display elements.

The OLED comprises an anode, an organic emitting layer and a cathode sequentially formed on a substrate. The respective functioning material layers and the cathode metal layer of the OLEDs are manufactured by vacuum thermal evaporating process. The vacuum thermal evaporating process needs the usage of the mask plate. The function of the mask plate is to evaporate the OLED material on the designed locations. Therefore, the aperture location, the shape and the surface planeness of the mask plate are significantly important. FIG. 1 is a diagram of an OLED material vacuum thermal evaporating process. The OLED material 200 for evaporation is put inside the crucible 100. In a vacuum environment which is smaller than $10^{-5}$ Pa, the temperature of the crucible 100 slowly ascends. After reaching the gasification temperature of the OLED material 200, the OLED material 200 becomes gas and sublimates to pass through the aperture of the mask plate 300. The gas molecules are deposed on the surface of the substrate 400, and become solid state molecules as temperature descends. Molecules of OLED material constantly accumulate and slowly form a thin film on the substrate 400.

Please refer from FIG. 2 to FIG. 6, which are diagrams of manufacture process of an OLED material vacuum thermal evaporating mask plate according to prior art. The manufacture process generally comprises: step 1, as shown in FIG. 2, manufacturing a stainless mask frame 10; step 2, as shown in FIG. 3, providing a mask substrate 20', and the mask substrate 20' is a stainless or ferro-nickel steel thin sheet with a thickness of 50 micrometers or 100 micrometers; step 3, as shown in FIG. 4, patterning the mask substrate 20', i.e. opening some small apertures 21 on the mask substrate 20' to form a mask 20; step 4, as shown in FIG. 5, applying a certain force around the mask 20 to make the surface to be flat, and the apertures 21 do not deform. Then, the mask 20 and the mask frame 10 are aligned; step 5, as shown in FIG. 6, the mask 20 and the mask frame 10 are welded by laser welding. After the aforesaid manufacture process is accomplished, the surface of the mask 20 is flat. The aperture 21 does not deform and the mask 20 can be easily handled with moving the mask frame 10.

After a certain usage duration of the mask, the OLED material with a certain thickness is deposed thereon, the mask can easily droop and deform with gravity, and the OLED material may block apertures or shrink the effective dimension of the apertures. After the certain usage duration, the mask needs cleaning and even replacement of a new one.

When a new mask is required for replacement, the original mask has to be separated from the mask frame. The mask is removed, and the mask frame surface is ground and polished. The original point weld location should have emboss and the mask frame surface needs to be ground to be a plane (the planeness is less than 50 micrometers) Meanwhile, in the original point weld location, the heat of welding is equivalent to a thermal process to the welding point, which can cause the hardness of the point weld location gets higher. This hardened layer also requires grinding to remove so not to influence the point weld result of the next mask.

Under such circumstance, after replacing the mask many times and the mask frame has been polished many times, the thickness will gradually become thinner, which not only influences structure strength of the frame but influences also the alignment location of the mask in the evaporating apparatus. Therefore, the mask frame needs to be wasted after grinding and polishing with a certain thickness, and the mask frame needs to be conveyed to the factory having a large polishing grinder for grinding and polishing. The time is wasting. Thus, many spare mask frames are essential and the production cost increases.

SUMMARY OF THE INVENTION

An objective of the present invention is to provide an OLED material vacuum thermal evaporating mask plate, of which the mask frame can be repeatedly used to diminish the waste amount and to raise the availability of the mask frame. Meanwhile, the spare amount of the mask frame can be reduced to save material and production cost.

For realizing the aforesaid objective, the present invention provides an OLED material vacuum thermal evaporating mask plate, comprising a mask frame, a quickset fixed on the mask frame and a mask fixed on the quickset;

the mask frame comprises four edges, and the four edges surround to form an opening corresponding to the mask; a surface of one side of the mask frame close to the mask is defined to be an upper surface, and each edge of the mask frame comprises a groove dented at the upper surface;

the quickset is fixed in the groove; the mask is fixed on the quickset by point weld, and welding points are on the quickset.

The quickset and the groove form a seamless tight fit in dimension.

At least two first stepped holes are located under each groove, and the first stepped hole comprises a first sink hole and a light aperture; the quickset comprises tapping holes corresponding to the first stepped holes; a first screw penetrates the light aperture to be locked in the tapping hole, and thus to fix the quickset in the groove.

At least one second stepped hole is located under each groove, and the second stepped hole comprises a second sink hole and a tapping through hole; a second screw is screwed in the tapping through hole; as quickset is to be extracted from the groove, the quickset can be lifted by rotating the second screw to push the quickset out of the groove.

A width of the groove is larger than 1.5 times of a diameter of the welding point, and a depth of the groove is smaller than ½ of a thickness of the mask frame.

Sectional shapes of the groove and the quickset are the same, and both are squares or rectangles.

Depths of the first sink hole and the second sink hole are smaller than ⅓ of a thickness of the mask frame.

Planenesses of an upper surface of the quickset and the upper surface of the mask frame are then same, and both are controlled to be less than 50 micrometers.

Materials of the quickset and the mask frame are the same, and both are stainless.

The quickset is an unitary type or a combined type.

The present invention further provides an OLED material vacuum thermal evaporating mask plate, comprising a mask frame, a quickset fixed on the mask frame and a mask fixed on the quickset;

the mask frame comprises four edges, and the four edges surround to form an opening corresponding to the mask; a surface of one side of the mask frame close to the mask is defined to be an upper surface, and each edge of the mask frame comprises a groove dented at the upper surface;

the quickset is fixed in the groove; the mask is fixed on the quickset by point weld, and welding points are on the quickset;

wherein the quickset and the groove form a seamless tight fit in dimension;

wherein at least two first stepped holes are located under each groove, and the first stepped hole comprises a first sink hole and a light aperture; the quickset comprises tapping holes corresponding to the first stepped holes; a first screw penetrates the light aperture to be locked in the tapping hole, and thus to fix the quickset in the groove.

The benefits of the present invention are: the present invention provides an OLED material vacuum thermal evaporating mask plate. Grooves are respectively located on the four edges of the mask frame, and the quickset is fixed in the grooves, and the mask is fixed on the quickset by point weld; when the mask deforms and the replacement is necessary, only the quickset is extracted for polishing but it will be not necessary to convey the entire mask frame to the factory having a large polishing grinder for grinding and polishing. The operation is simple and time saving. It can be prevented that the thickness of the mask frame gets thinner caused by polishing and the mask frame has to be wasted due to many times of polishing the mask frame; when the quickset has been implemented with polishing many times and the thickness becomes unqualified, it will be alright to replace only the quickset but not waste the entire mask frame. Thus, the mask frame can be repeatedly used to diminish the waste amount and to raise the availability of the mask frame. Meanwhile, the spare amount of the mask frame can be reduced and few spare quicksets are enough to save material and production cost.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

Figure 1:
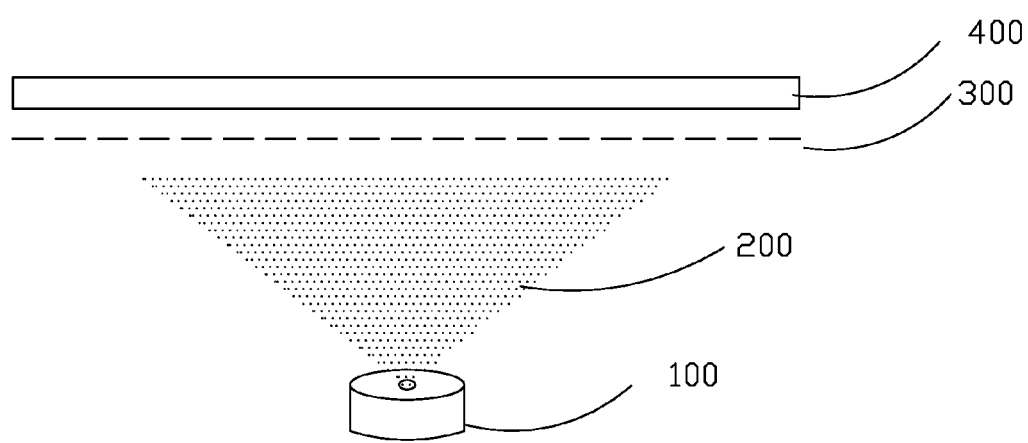
FIG. 1 is a diagram of an OLED material vacuum thermal evaporating process.
Figure 2:
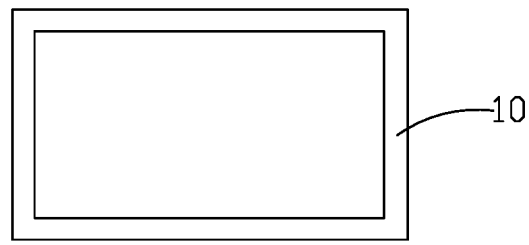
FIG. 2 is a diagram of step 1 in a manufacture process of an OLED material vacuum thermal evaporating mask plate according to prior art.
Figure 3:
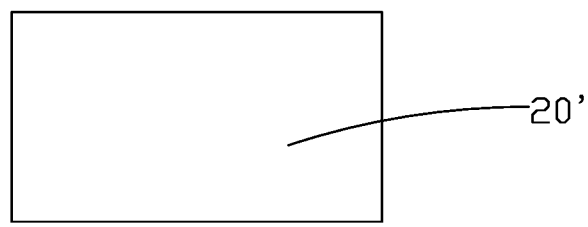
FIG. 3 is a diagram of step 2 in the manufacture process of the OLED material vacuum thermal evaporating mask plate according to prior art.
Figure 4:
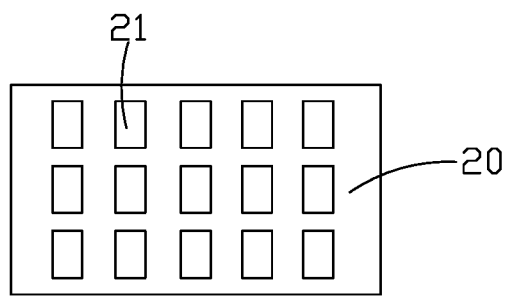
FIG. 4 is a diagram of step 3 in the manufacture process of the OLED material vacuum thermal evaporating mask plate according to prior art.
Figure 5:
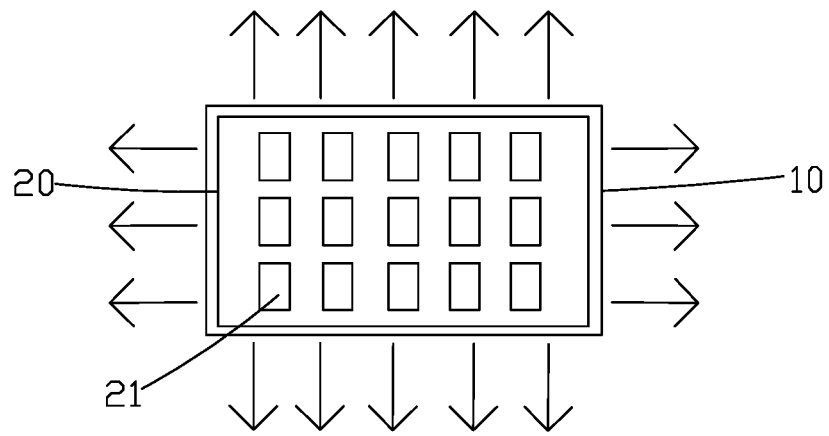
FIG. 5 is a diagram of step 4 in the manufacture process of the OLED material vacuum thermal evaporating mask plate according to prior art.
Figure 6:
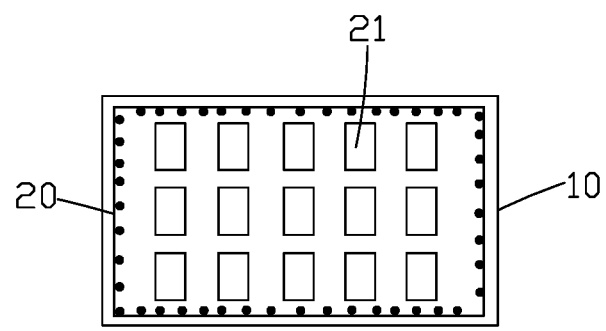
FIG. 6 is a diagram of step 5 in the manufacture process of the OLED material vacuum thermal evaporating mask plate according to prior art.
Figure 7:
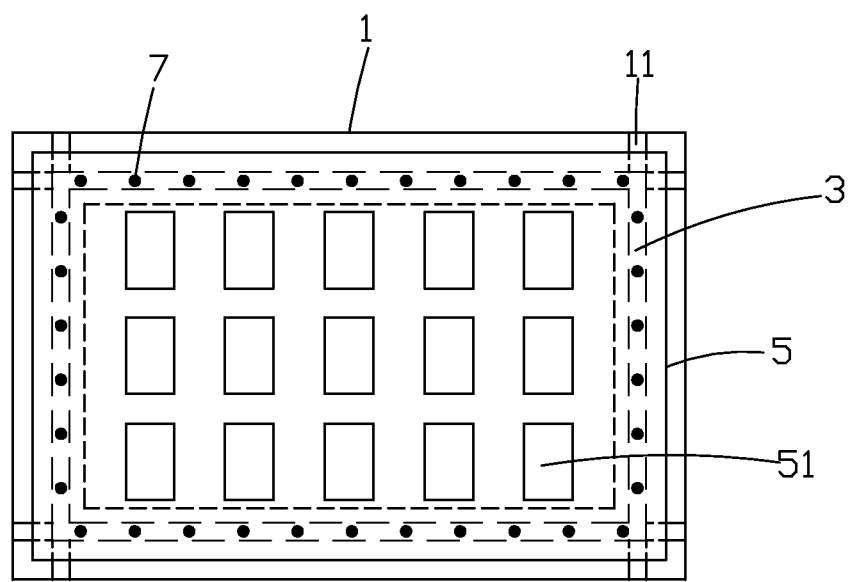
FIG. 7 is top view diagram of an OLED material vacuum thermal evaporating mask plate according to the present invention.

For better explaining the technical solution and the effect of the present invention, the present invention will be further described in detail with the accompanying drawings and the specific embodiments.

Please refer to FIG. 7 to FIG. 10. The present invention provides an OLED material vacuum thermal evaporating mask plate, comprising a mask frame 1, a quickset 3 fixed on the mask frame 1 and a mask 5 fixed on the quickset 3.

The mask frame 1 comprises four edges, and the four edges surround to form an opening corresponding to the mask 5. A surface of one side of the mask frame 1 close to the mask 5 is defined to be an upper surface, and each edge of the mask frame 1 comprises a groove 11 dented at the upper surface.

The quickset 3 is fixed in the groove 11. The mask 5 is fixed on the quickset 3 by point weld, and welding points 7 are on the quickset 3.

The mask 5 comprises a plurality of apertures 51 penetrating the thickness thereof, and the plurality of apertures 51 penetrating the thickness of mask 5 construct patterns for the OLED thermal evaporating areas.

Specifically, sectional shapes of the groove 11 and the quickset 3 are the same, and both are squares or rectangles but not limited thereto. Besides, the quickset 3 and the groove 11 form a seamless tight fit in dimension.

A width of the groove 11 is larger than 1.5 times of a diameter of the welding point 7 to be enough for accommodating the welding point 7. A depth of the groove 11 is smaller than ½ of a thickness of the mask frame 1.

Planenesses of an upper surface of the quickset 3 and the upper surface of the mask frame 1 are then same, and both are controlled to be less than 50 micrometers to ensure the planeness of the mask 5 after being fixed to accurately align the mask 5.

Materials of the quickset 3 and the mask frame 1 are the same, and both are stainless.

Figure 8:
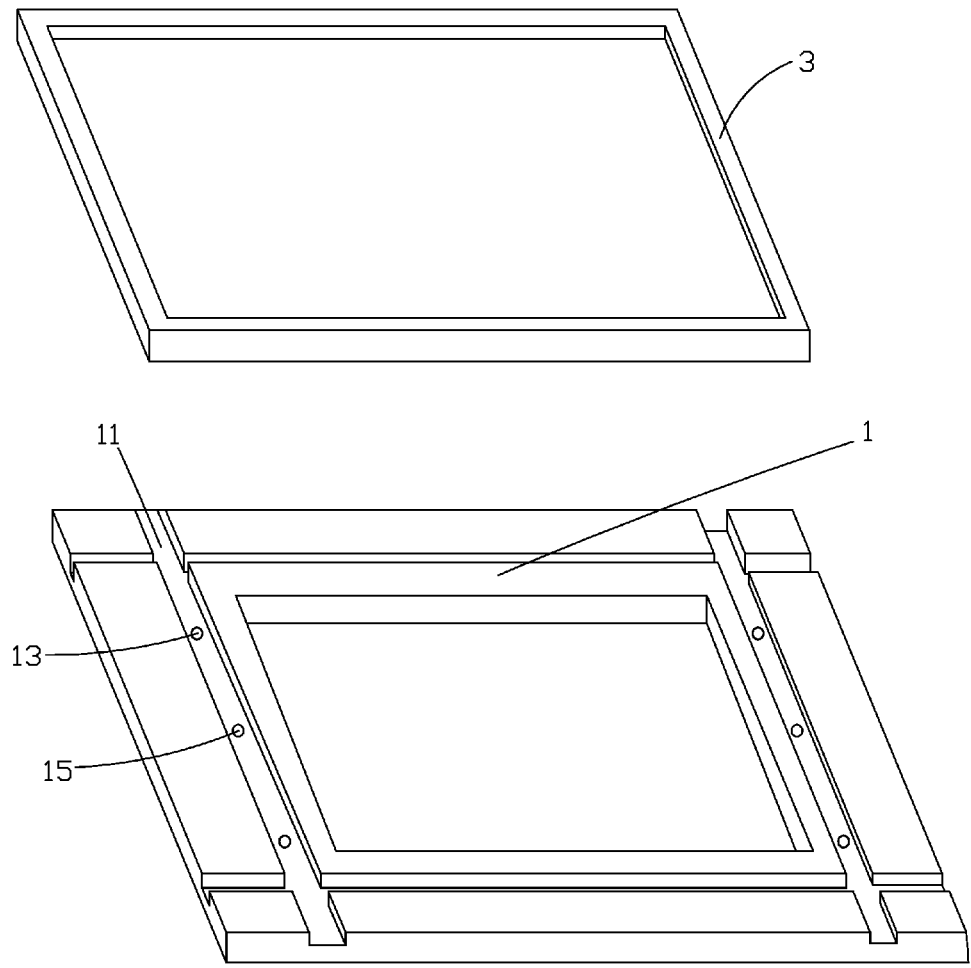
FIG. 8 is a solid exploded diagram of the mask frame and the quickset of the OLED material vacuum thermal evaporating mask plate according to the present invention.

The quickset 3 is an unitary type or a combined type. As shown in FIG. 8, the quickset 3 can be a complete unitary rectangular frame, or a rectangular frame formed by combing two, three, four or eight bars.

Figure 9:
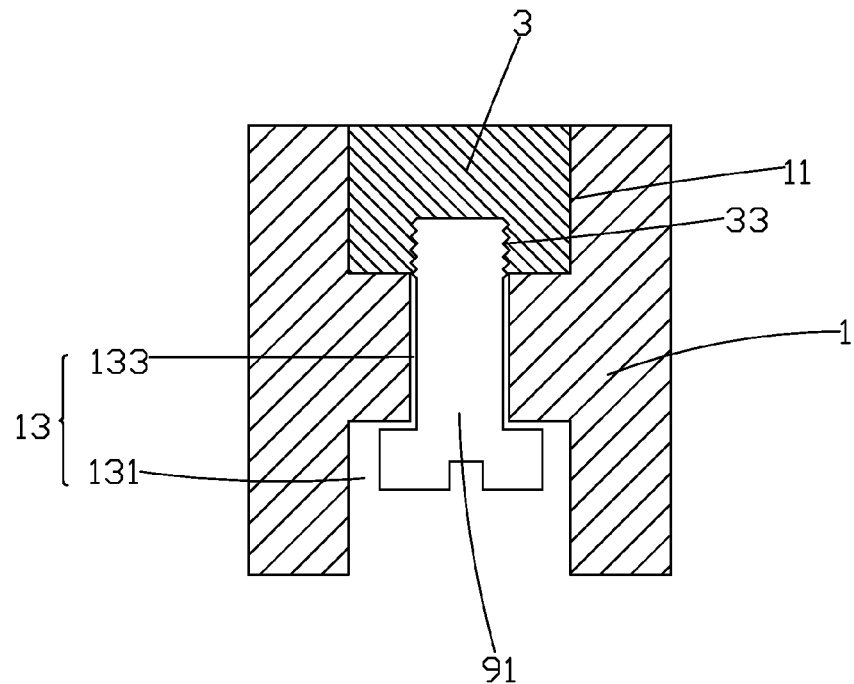
FIG. 9 is a sectional diagram of the location corresponding to the first stepped hole in the OLED material vacuum thermal evaporating mask plate according to the present invention.
Figure 10:
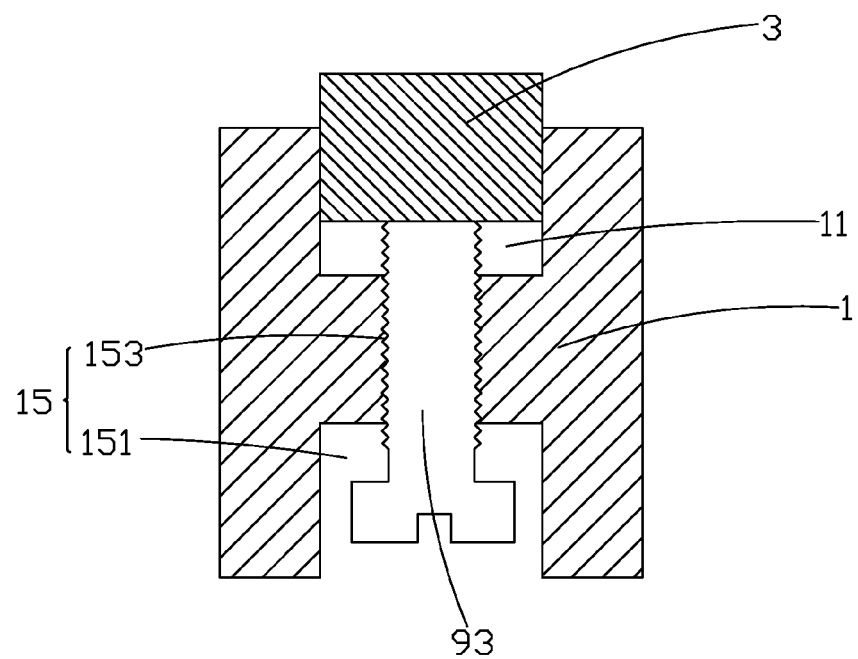
FIG. 10 is a sectional diagram of the location corresponding to the second stepped hole in the OLED material vacuum thermal evaporating mask plate according to the present invention.

Furthermore, as shown in FIG. 9, at least two first stepped holes 13 are located under each groove 11, and the first stepped hole 13 comprises a first sink hole 131 and a light aperture 133. Preferably, the at least two first stepped holes 13 are symmetrical relative to the centre line of the mask frame 1. The quickset 3 comprises tapping holes 33 corresponding to the first stepped holes 13. A first screw 91 penetrates the light aperture 133 to be locked in the tapping hole 33, and thus to fix the quickset 3 in the groove 11. Depths of the first sink hole 131 is smaller than ⅓ of a thickness of the mask frame 1, which is employed for accommodating the head of the first screw 91 to prevent the head of the first screw 91 protruding the upper surface of the mask frame 1.

With the aforesaid structure, as the mask 4 deforms and needs to be replaced, only the first screw 91 has to be loosened to extract the quickset 3 for polishing process but it will be not necessary to convey the entire mask frame 1 to the factory having a large polishing grinder for grinding and polishing. The operation is simple and time saving. It can be prevented that the thickness of the mask frame 1 gets thinner caused by polishing and the mask frame 1 has to be wasted due to many times of polishing the mask frame 1; when the quickset 3 has been implemented with polishing many times and the thickness becomes unqualified, it will be alright to replace only the quickset 3 but not waste the entire mask frame 1. Thus, the mask frame 1 can be repeatedly used to diminish the waste amount of the mask frame 1 and to raise the availability of the mask frame 1. Meanwhile, the spare amount of the mask frame 1 can be reduced and few spare quicksets 3 are enough to save material and production cost.

Because the quickset 3 and the groove 11 form a seamless tight fit in dimension, as the quickset 3 needs to be extracted for polishing or to be replaced, at least one second stepped hole 15 is located under each groove 11, and the second stepped hole 15 comprises a second sink hole 151 and a tapping through hole 153, and the quickset 3 does not have a hole corresponding to the location of the second stepped hole 15; a second screw 93 is screwed in the tapping through hole 153, and the tapping section of the second screw 93 is longer; as quickset 3 needs to be extracted from the groove 11, the quickset 3 can be lifted by rotating the second screw 93 to push the quickset 3 out of the groove 11 and to be convenient of extracting the quickset 3 from the groove 11. Depths of the second sink hole 151 are smaller than ⅓ of a thickness of the mask frame 1, which is to prevent that burr is generated during the screw rotation, and the burr influences the planeness of the lower surface of the mask frame 1.

The aforesaid OLED material vacuum thermal evaporating mask plate is applied in the evaporation of OLED organic material and inorganic material, such as Lithium Fluoride (LiF). Certainly, the mask plate can be applied in other vacuum thermal evaporations.

In conclusion, in the present invention provides an OLED material vacuum thermal evaporating mask plate, grooves are respectively located on the four edges of the mask frame, and the quickset is fixed in the grooves, and the mask is fixed on the quickset by point weld; when the mask deforms and the replacement is necessary, only the quickset is extracted for polishing but it will be not necessary to convey the entire mask frame to the factory having a large polishing grinder for grinding and polishing. The operation is simple and time saving. It can be prevented that the thickness of the mask frame gets thinner caused by polishing and the mask frame has to be wasted due to many times of polishing the mask frame; when the quickset has been implemented with polishing many times and the thickness becomes unqualified, it will be alright to replace only the quickset but not waste the entire mask frame. Thus, the mask frame can be repeatedly used to diminish the waste amount and to raise the availability of the mask frame. Meanwhile, the spare amount of the mask frame can be reduced and few spare quicksets are enough to save material and production cost.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An OLED material vacuum thermal evaporating mask plate, comprising a mask frame, a quickset fixed on the mask frame and a mask fixed on the quickset;

the mask frame comprises four edges, and the four edges surround to form an opening corresponding to the mask; a surface of one side of the mask frame close to the mask is defined to be an upper surface, and each edge of the mask frame comprises a groove dented at the upper surface;

the quickset is fixed in the groove; the mask is fixed on the quickset by point weld, and welding points are on the quickset, wherein at least one second stepped hole is located under each groove, and the second stepped hole comprises a second sink hole and a tapping through hole; a second screw is screwed in the tapping through hole; as quickset is to be extracted from the groove, the quickset can be lifted by rotating the second screw to push the quickset out of the groove.

2. The OLED material vacuum thermal evaporating mask plate according to claim 1, wherein the quickset and the groove form a seamless tight fit in dimension.

3. The OLED material vacuum thermal evaporating mask plate according to claim 1, wherein a width of the groove is larger than 1.5 times of a diameter of the welding point, and a depth of the groove is smaller than ½ of a thickness of the mask frame.

4. The OLED material vacuum thermal evaporating mask plate according to claim 1, wherein sectional shapes of the groove and the quickset are the same, and both are squares or rectangles.

5. The OLED material vacuum thermal evaporating mask plate according to claim 1, wherein depths of the first sink hole and the second sink hole are smaller than ⅓ of a thickness of the mask frame.

6. The OLED material vacuum thermal evaporating mask plate according to claim 1, wherein materials of the quickset and the mask frame are the same, and both are stainless steel.

7. The OLED material vacuum thermal evaporating mask plate according to claim 1, wherein the quickset is an unitary type or a combined type.

8. An OLED material vacuum thermal evaporating mask plate, comprising a mask frame, a quickset fixed on the mask frame and a mask fixed on the quickset;

the mask frame comprises four edges, and the four edges surround to form an opening corresponding to the mask; a surface of one side of the mask frame close to the mask is defined to be an upper surface, and each edge of the mask frame comprises a groove dented at the upper surface;

the quickset is fixed in the groove; the mask is fixed on the quickset by point weld, and welding points are on the quickset;

wherein the quickset and the groove form a seamless tight fit in dimension;

wherein at least one second stepped hole is located under each groove, and the second stepped hole comprises a second sink hole and a tapping through hole; a second screw is screwed in the tapping through hole; as quickset is to be extracted from the groove, the quickset can be lifted by rotating the second screw to push the quickset out of the groove.

9. The OLED material vacuum thermal evaporating mask plate according to claim 8, wherein a width of the groove is larger than 1.5 times of a diameter of the welding point, and a depth of the groove is smaller than ½ of a thickness of the mask frame.

* * * * *